US006999306B2

(12) United States Patent
Walczak et al.

(10) Patent No.: US 6,999,306 B2
(45) Date of Patent: Feb. 14, 2006

(54) METHOD AND SYSTEM AND APPARATUS FOR STORING DATA STORAGE DEVICES

(75) Inventors: Kylo Walczak, Houston, TX (US); Rich Palmer, The Woodlands, TX (US); Bret Gibbs, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 179 days.

(21) Appl. No.: 10/645,140

(22) Filed: Aug. 21, 2003

(65) Prior Publication Data

US 2005/0041386 A1    Feb. 24, 2005

(51) Int. Cl.
*G06F 1/16* (2006.01)
(52) U.S. Cl. .................. 361/684; 361/685; 211/41.11; 211/126.11
(58) Field of Classification Search ............... 361/685, 361/684; 211/41.11–41.12, 126.11, 126.12, 211/126.15, 88.01, 162
See application file for complete search history.

(56) References Cited

U.S. PATENT DOCUMENTS

| | | | | |
|---|---|---|---|---|
| 4,488,645 A | * | 12/1984 | Yamaguchi | 206/307.1 |
| 4,730,735 A | | 3/1988 | Lechner | |
| 5,097,946 A | * | 3/1992 | Emrich | 206/745 |
| 5,168,424 A | * | 12/1992 | Bolton et al. | 361/695 |
| 5,184,736 A | | 2/1993 | Banker | |
| 5,269,409 A | * | 12/1993 | Brandt et al. | 206/303 |
| 5,894,941 A | | 4/1999 | Woodruff | |
| 6,039,190 A | * | 3/2000 | Clausen | 211/40 |
| 6,332,546 B1 | * | 12/2001 | Hunt | 211/40 |
| 6,535,381 B1 | * | 3/2003 | Jahne et al. | 361/685 |
| 6,583,989 B1 | | 6/2003 | Guyer et al. | |
| 6,654,239 B1 | * | 11/2003 | Smith | 361/685 |
| 6,804,877 B1 | * | 10/2004 | Mueller et al. | 29/603.03 |

* cited by examiner

*Primary Examiner*—Yean-Hsi Chang

(57) ABSTRACT

A computer rack system comprises electronic components; a rack including means for supporting the electronic components therein; and a drawer slidably mounted in the rack and configured to receive at least one data storage device.

17 Claims, 2 Drawing Sheets

METHOD AND SYSTEM AND APPARATUS FOR STORING DATA STORAGE DEVICES

BACKGROUND

Various pieces of computer equipment such as servers and tape drives are often mounted in racks, sometimes referred to as rack consoles. Each rack includes a frame that defines an interior volume. The electronic components are mounted in the interior volume by affixing them to the frame.

Data processed or generated by computers is often stored on magnetic tapes or other memory devices. Tapes are available in various dimensions. Tapes containing data may be reused or may be archived, depending on the needs of the user. Often the needs of the user make it desirable to have on hand a plurality of tapes. At the same time, the needs of the user may make it desirable to transport batches of tapes to or from the vicinity of the tape drive, such as when it is desired to archive a batch of tapes.

SUMMARY

In one exemplary embodiment, a computer rack system comprises electronic components; a rack including means for supporting said electronic components therein; and a drawer slidably mounted in said rack and configured to receive at least one data storage device.

In another exemplary embodiment, a method for storing magnetic tapes for use in a computer system that is supported in a frame comprises providing a pair of slidable rails engaging the frame; and providing a drawer in slidable engagement with said rails, said drawer being configured to receive at least one magnetic tape.

Other embodiments and variations of these embodiments are shown and taught in the accompanying drawings and detailed description.

BRIEF DESCRIPTION OF THE DRAWINGS

A better understanding of the disclosed systems and apparatus may be obtained by reference to the following drawings, in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure. In addition, one skilled in the art will understand that the following description has broad application, and the discussion of any embodiment is meant only to be exemplary of that embodiment, and not intended to intimate that the scope of the disclosure is limited to that embodiment.

Figure 1:
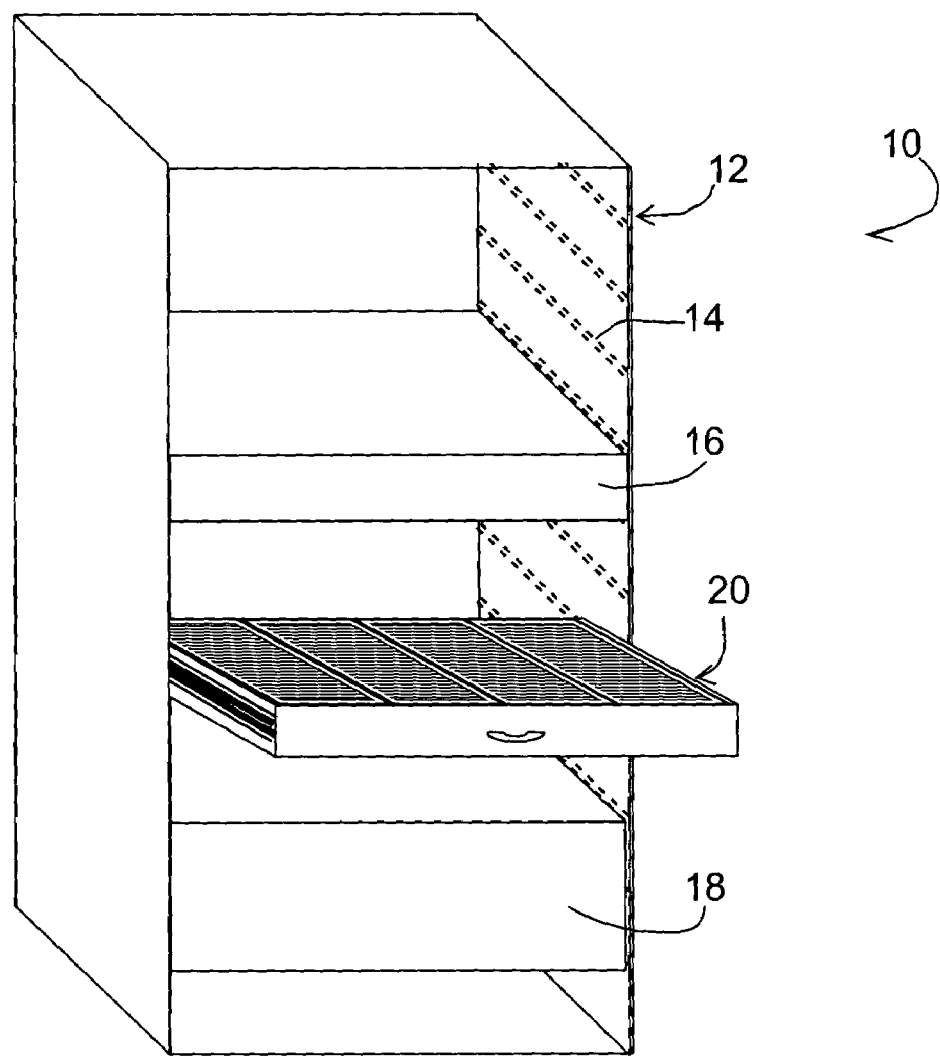
FIG. 1 illustrates a computer system in accordance with certain embodiments of the invention.

Referring now to FIG. 1, a computer system 10 may comprise a rack 12 that includes at least one means 14 for mounting electronic components, such as microprocessors 16 and/or tape drives 18, therein. Mounting means 14 may comprise devices such as slots, screws, rails, brackets, shelves, or combinations thereof. In at least some embodiments of the invention, at least one drawer 20 for storing electronic media is mounted in rack 12 as described in detail below.

Figure 2:
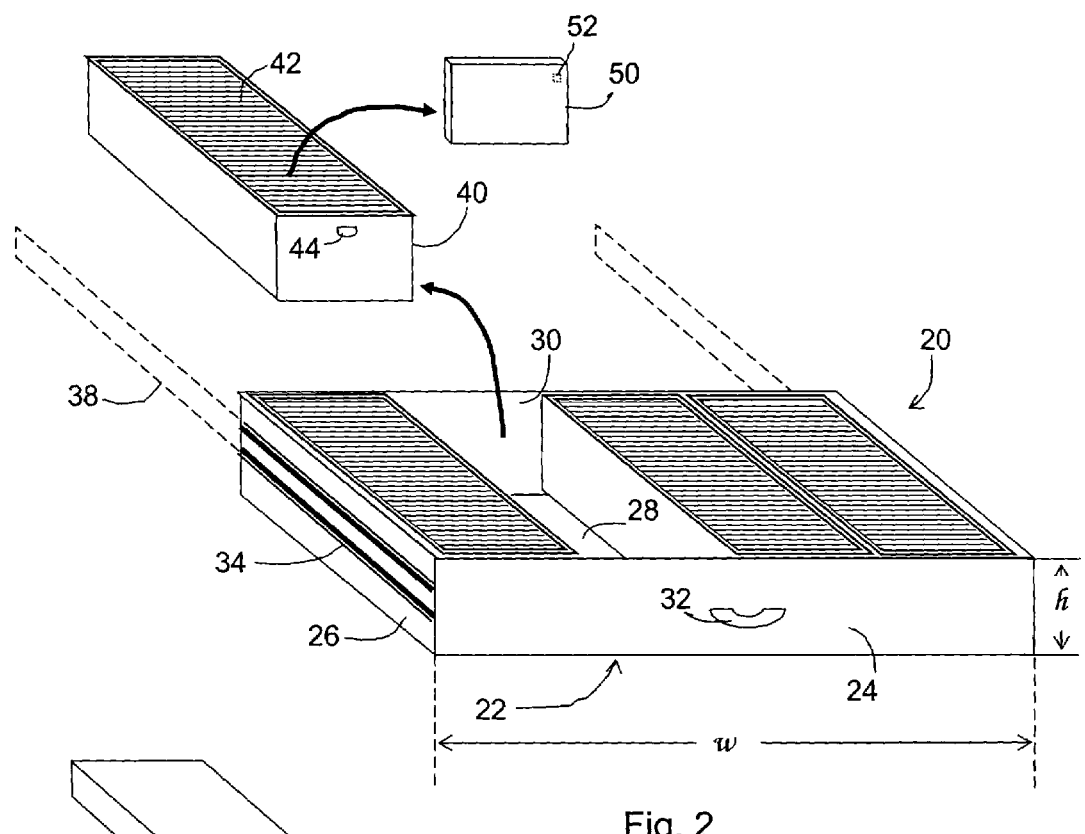
FIG. 2 illustrates a tape storage drawer in accordance with certain embodiments of the invention.

Referring now to FIG. 2, at least some embodiments of the present storage drawer 20 comprise a rectilinear container 22 having a front panel 24, side panels 26, a floor 28, a rear wall 30 and an open top. A handle 32 may be included on front panel 24 or in any other desirable location on drawer 20. A support means 34 may be provided on each side panel 26. In certain embodiments, support means 34 is a drawer glide, rail, or other sliding mechanism. In some instances, each support means 34 may be accompanied by corresponding or mating member 38 (shown in phantom) that slidably engages support means 34 and can be affixed to a mounting means 14 located on an interior wall of rack 12.

Racks and the electronic components housed therein may be constructed using standardized units of length. For example, the interior volume of a rack may have a width that complies with industry NEMA standards, such as 19 inches. Likewise, racks may be constructed to receive components that have a height that complies with Industry NEMA standards. Standardized heights may be multiples of a rack unit or "U," where one U equals 1.75 inches.

Drawer 20 may have a width w that allows the drawer to be received in rack 12 along with support means 34 and mating members 38. Likewise, drawer 20 may have a height h that corresponds to an integral number of U's, such as 1.75 inches, 3.5 inches, or 5.25 inches. In various embodiments, the overall height h of drawer 20 is 2U, 3U, or 4U.

Still referring to FIG. 2, drawer 20 may be adapted to receive therein one or more removable trays 40. In some embodiments, each tray 40 may have a length that substantially corresponds to the depth of drawer 20. For example, a plurality of trays may be placed parallel and adjacent each other and extend along the inside of drawer 20. In other embodiments (not shown), trays 40 may be oriented differently within each drawer 20. For example, the tray could extend in a width-wise direction of the drawer.

Each tray 40 may be sized so as to accommodate at least one data storage device 50, such as a magnetic storage medium. Data storage devices that are suitable for use with the present invention may comprise tape cartridges, including but not limited to DAT, AIT or similar cartridges, DLT/SDLT, LTO or similar cartridges. For example, FIG. 2 shows a plurality of data storage devices disposed in each tray. The data storage devices are arranged back-to-back in a stacking arrangement and extend along the length of the tray. In this exemplary stacking arrangement, numerous data storage devices can be placed and stored in a single tray.

In some embodiments, each tray 40 includes a plurality of slots 42 that are each configured to receive one data storage device 50. The slots may be configured such that the data storage device can be vertically maneuvered into and out of the slot. Further, the slots may be configured to secure one or more data storage devices and prevent them from falling over or otherwise shifting or moving while positioned in the slot. If desired, data storage device 50 may be retained in slots 42 by retaining means (not shown). As shown in FIG. 2, trays 40 and slots 42 may be configured to support data storage devices 50 in a substantially upright position. Alternatively, trays 40 and slots 42 may be configured so that data storage devices 50 are supported in another position, such as an inclined position. For example, data storage devices 50 may be tilted forward so that information that may be present on their upper or exposed faces can be more readily accessed or viewed by an operator using drawer 20. In another embodiment, the angle at which data storage devices 50 are stored is sufficient to enable tray 40 to have a height that is at least 1U less than it would be if cartridges 50 were stored upright. In another embodiment, drawer 20 is itself configured to receive, support, and optionally retain one or more tapes.

Drawer 20 may be sized such that two, three, four, or more trays 40 may be received in drawer 20. Each tray 40 may include one or more removing means such as finger hole 44. When it is desired to store multiple data storage devices in the vicinity of a computer system that is housed in rack 12, a drawer 20 can be installed in any open slot by affixing mating members 38 to mounting means 14 and sliding support means 34 into engagement therewith. When it is desired to transport several data storage devices at one time, drawer 20 can be opened and a tray 40 removed and used to transport data storage devices 50 to another location such as offsite storage.

Figure 3:
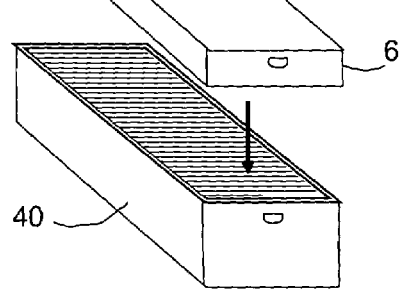
FIG. 3 illustrates an embodiment of a data storage device tray that can be used in conjunction with the drawer of FIG. 2.

If desired, one or more trays 40 may be provided with a lid 60, as illustrated in FIG. 3. Lid 60 may be wholly removable or may be attached to tray 40, for example with a hinge located at the rear or end of the tray. In alternative embodiments, lid 60 may be a collapsible member, such as a pleated material, that can be drawn across the top of tray 40 so as to enclose the contents thereof. If further desired, lid 60 and/or tray 40 can be provided with a locking mechanism (not shown). The locking mechanism can be used to retain lid 60 in a closed position and to prevent unauthorized access to any data storage devices that may be stored in tray 40.

In some embodiments, one or more of data storage devices 50 include a memory chip 52 (FIG. 2) embedded therein. Chip 52 can be used in conjunction with an external reader or writer, to store and/or convey information about the usage life, condition and whereabouts of the data storage device in which it resides. In some embodiments, chips 52 will receive data from the equipment into which data storage devices 50 are inserted, such as tape drives or libraries.

While the invention is susceptible to various modifications and alternative forms, embodiments of the invention are shown by way of example in the drawings and described herein. It should be understood, however, that the drawings and detailed description are not intended to limit the invention to the particular form disclosed, but on the contrary, the invention is to cover all modifications, equivalents and alternatives falling within the spirit and scope of the present invention as defined by the appended claims.

What is claimed is:

1. A computer rack system, comprising:
   electronic components;
   a rack including means for supporting said electronic components therein; and
   a drawer slidably mounted in said rack and configured to receive at least one data storage device, further including at least one removable tray in said drawer, wherein said tray includes a lid and said lid includes means for locking said lid in a closed position.

2. The system according to claim 1 wherein said drawer includes means for supporting said data storage device in a desired position.

3. The system according to claim 1 wherein said drawer is configured to receive a plurality of data storage devices.

4. The system according to claim 1 wherein said drawer has a height that is an integral multiple of 1.75 inches (4.45 cm).

5. The system according to claim 1 wherein said tray includes means for supporting said data storage device in a desired position.

6. The system according to claim 1 wherein said tray is configured to support said data storage device in a desired position such that an exposed face of said data storage device is visible.

7. The system according to claim 6 said data storage device is supported in an inclined position.

8. The system according to claim 1 wherein said tray is configured to receive a plurality of data storage devices.

9. A computer rack system, comprising:
   electronic components;
   a rack including means for supporting said electronic components therein; and
   a drawer slidably mounted in said rack and configured to receive at least one data storage device, wherein said data storage device includes a memory chip.

10. A computer system, comprising:
    a rack comprising a mounting means disposed along an interior surface;
    a microprocessor mounted in said rack;
    at least one drawer mounted in said rack, said drawer being slidably engageable along said mounting means;
    a plurality of trays disposed in said drawer, the trays being removable from the drawer and disposed parallel to each other in said drawer; and
    a plurality of data storage devices disposed in each of said trays, at least one of said data storage devices including a memory chip and said data storage devices being removable from said trays and arranged back-to-back in a stacking arrangement.

11. The computer system according to claim 10 wherein:
    said drawer is removable from said rack; and
    said trays extend along a lengthwise direction of said drawer.

12. A method for storing magnetic tapes for use in a computer system that is supported in a frame, comprising:
    providing a rack comprising a means for receiving a plurality of drawers;
    slidably engaging at least one drawer along the means for receiving;
    positioning a plurality of trays in the at least one drawer, the trays being removable from the at least one drawer; and
    stacking a plurality of magnetic tapes in each of the trays, the magnetic tapes being removable from the trays and at least one of said magnetic tapes including a memory chip.

13. The method of claim 12, further comprising arranging the trays in a parallel orientation with each other.

14. The method of claim 13, further comprising stacking the magnetic tapes at an angle within the at least one drawer such that a face of the magnetic tape is angled with respect to the at least one drawer.

15. The method of claim 13, further comprising providing a plurality of slots in the trays, and positioning the magnetic tapes in the slots to prevent the magnet tapes from falling over.

16. The method of claim 13, further comprising providing the at least one drawer with a height and a length that is an integral multiple of the height.

17. The method of claim 13, further comprising positioning at least three trays in the at least one drawer, the three trays being parallel to each other and extending along a length of the at least one drawer.

* * * * *